(12) United States Patent
Wenzel et al.

(10) Patent No.: US 9,974,174 B1
(45) Date of Patent: May 15, 2018

(54) PACKAGE TO BOARD INTERCONNECT STRUCTURE WITH BUILT-IN REFERENCE PLANE STRUCTURE

(71) Applicant: FREESCALE SEMICONDUCTOR, INC., Austin, TX (US)

(72) Inventors: Robert Wenzel, Austin, TX (US); Tingdong Zhou, Austin, TX (US); David Clegg, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/334,734

(22) Filed: Oct. 26, 2016

(51) Int. Cl.
| | |
|---|---|
| H05K 1/11 | (2006.01) |
| H05K 3/34 | (2006.01) |
| H05K 1/14 | (2006.01) |
| H05K 1/02 | (2006.01) |
| H05K 1/09 | (2006.01) |

(52) U.S. Cl.
CPC .......... H05K 1/115 (2013.01); H05K 1/0224 (2013.01); H05K 1/09 (2013.01); H05K 1/111 (2013.01); H05K 1/144 (2013.01); H05K 3/3436 (2013.01); H05K 3/3452 (2013.01); H05K 2201/041 (2013.01); H05K 2201/10378 (2013.01); H05K 2201/10734 (2013.01); H05K 2203/041 (2013.01)

(58) Field of Classification Search
CPC ... H05K 1/00; H05K 1/02; H05K 1/11; H05K 1/18; H05K 1/117; H05K 1/219; H05K 3/20; H05K 3/36; H01L 21/02; H01L 21/48; H01L 21/70; H01L 23/02; H01L 23/34; H01L 23/48; H01L 23/50; H01L 23/52

USPC ........ 361/767, 262, 752, 764, 795; 174/257, 174/258, 263, 266, 534, 557, 558; 257/23.04, 276, 686, 701; 438/637
See application file for complete search history.

(56) References Cited

U.S. PATENT DOCUMENTS

| | | |
|---|---|---|
| 5,914,859 A | 6/1999 | Takada et al. |
| 6,316,737 B1 | 11/2001 | Evans et al. |
| 6,875,921 B1 * | 4/2005 | Conn .............. H01L 23/50 174/534 |
| 7,081,650 B2 | 7/2006 | Palanduz et al. |
| 7,310,239 B1 * | 12/2007 | Fjelstad .............. H01L 23/13 257/E23.004 |
| 7,507,914 B2 | 3/2009 | Levine et al. |

(Continued)

OTHER PUBLICATIONS

Aries Electronics, Inc., "Long-Life Hi-Frequency Sockets for BGA, LGA, QFN, MLCC, uBGA and Bumped Die Devices / High-Performance Interposer Contact Technology Suitable for Manual & Automated High-Volume Production Test," Dec. 18, 2015, http://www.arieselec.com/products/data/24005-long-life-hi-frequency-sockets.htm, 3 pages.

(Continued)

Primary Examiner — Xiaoliang Chen

(57) ABSTRACT

Embodiments of an interconnect structure are provided, the interconnect structure including: a reference plane structure having a first major surface and a second major surface opposite the first major surface, the reference plane structure including a plurality of through holes from the first major surface to the second major surface; a plurality of conductive columns, each conductive column centered within a through hole; and a plurality of isolation structures, each isolation structure fills an annular region within the through hole between each conductive column and surrounding portion of the reference plane structure.

19 Claims, 8 Drawing Sheets

(56) References Cited

U.S. PATENT DOCUMENTS

| | | | |
|---|---|---|---|
| 7,566,960 B1* | 7/2009 | Conn | H01L 23/055 257/678 |
| 7,800,230 B2 | 9/2010 | Hirano et al. | |
| 9,070,653 B2 | 6/2015 | Stephens et al. | |
| 2002/0020862 A1* | 2/2002 | Livengood | H01L 21/76898 257/276 |
| 2002/0076919 A1* | 6/2002 | Peters | H01L 23/49822 438/637 |
| 2002/0085364 A1* | 7/2002 | Downes, Jr. | H01L 21/4853 361/816 |
| 2003/0020156 A1* | 1/2003 | Farquhar | H01L 21/4853 257/701 |
| 2003/0147227 A1* | 8/2003 | Egitto | H01L 21/4853 361/795 |
| 2007/0289773 A1* | 12/2007 | Caletka | H05K 1/0219 174/262 |
| 2008/0301933 A1* | 12/2008 | Miller | H05K 1/117 29/830 |
| 2009/0278246 A1* | 11/2009 | Hoshino | H01L 21/6835 257/686 |
| 2012/0105096 A1* | 5/2012 | Kuah | G01R 31/2812 324/763.01 |
| 2013/0033827 A1* | 2/2013 | Das | H05K 3/462 361/752 |
| 2014/0048319 A1* | 2/2014 | Pan | H05K 1/0216 174/258 |
| 2017/0018492 A1* | 1/2017 | Imayoshi | H01L 23/49894 |

OTHER PUBLICATIONS

Spectrum Integrity, "ISC Socket Solutions," 2008, www.spectrumintegrity.com, 1 page.

Winslow Automation, Inc., "BGA Reball Starter Kit, SolderQuik," SM-4064 Rev A, 2003, www.solderquik.com, 36 pages.

\* cited by examiner

PACKAGE TO BOARD INTERCONNECT STRUCTURE WITH BUILT-IN REFERENCE PLANE STRUCTURE

BACKGROUND

Field

This disclosure relates generally to packaged semiconductor devices, and more specifically, to interconnections between a package substrate and printed circuit board.

Related Art

In a semiconductor package that includes a typical ball grid array (BGA) device, the BGA device is connected to a printed circuit board (PCB) by a number of solder balls. Signal integrity through the solder balls between the BGA device and the PCB is often degraded due to parasitic capacitance from the bulk solder material, the solder ball shape, the large distance between a signal and ground return ball, and the direct adjacency of different signals leading to high crosstalk coupling between the signals. Additionally, only a finite number of solder balls, dependent on ball pitch and size, can fit within the body size of the semiconductor package, thereby limiting the number of pins available for signal lines, power lines, and ground lines. Body size is a significant cost factor for both the semiconductor package and the PCB to which the semiconductor package will ultimately be mounted.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
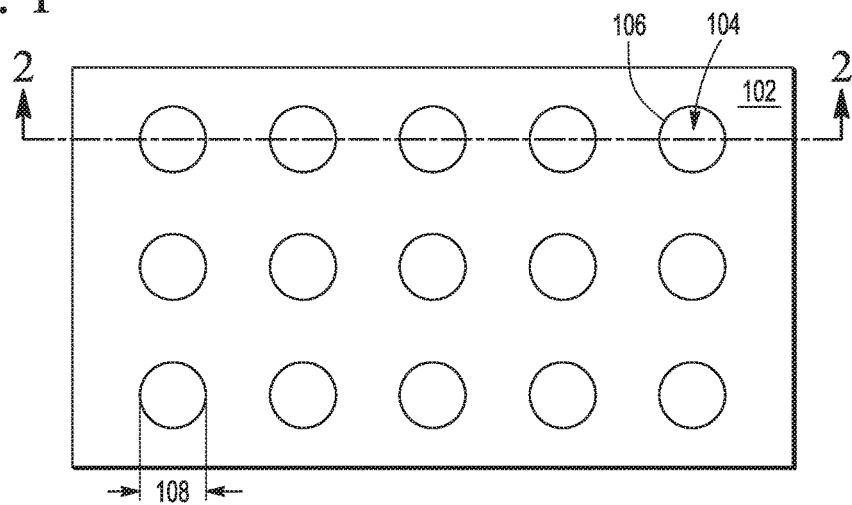
FIG. 1-12 illustrate block diagrams depicting top-down and side views of various example steps for fabricating an interconnect structure of the present disclosure.

The following sets forth a detailed description of various embodiments intended to be illustrative of the invention and should not be taken to be limiting.

Overview

The present disclosure provides an interconnect structure that eliminates the use of solder balls in a packaged semiconductor device that includes a ball grid array (BGA) device, a land grid array (LGA) device, or other leaded device. The interconnect structure utilizes conductive columns, rather than solder balls, to provide signal and power connections from a package substrate to a printed circuit board (PCB). The conductive columns extend through a reference plane structure, where each conductive column has a surrounding isolation structure that laterally separates and electrically isolates the conductive columns from the reference plane structure. The reference plane structure has exposed contact areas on the top and bottom surface in the interstitial area between the conductive columns, where the exposed contact areas provide reference plane connections to the package substrate and the PCB. As a result, the grid array of the package substrate need not include dedicated reference plane (such as ground) pins, which increases the number of pins available for signal and power. For example, a common design approach with BGA devices is to dedicate one ground pin (or ground ball) for every four signals. If 80 signals are present, then 20 ground pins are required, for a total pin count of 100 or a 10×10 array. The present disclosure provides a reference plane (or ground) connection between and around each signal without requiring dedicated ground pins, instead requiring a smaller 9×9 array. Alternatively, the 10×10 array may be used, with the 20 additional pins available for signal and power.

Beneficially, the reference plane structure between and around the conductive columns protects the signal and power connections from electromagnetic interference. The interconnect structure improves electrical characteristics, such as insertion loss and return loss, and reduces crosstalk by as much as 10 dB, across the operating frequency spectrum of a packaged semiconductor device that includes the interconnect structure. This results in improved signal integrity between the package substrate and the PCB, due in part to the columnar nature of the signal and power connections (rather than spherical) provided by the interconnect structure. While the present disclosure is especially beneficial for large grid arrays having body size of 20 mm and above and pins on 1 mm pitch or less, the present disclosure is applicable to any size and configuration of semiconductor package substrate.

The interconnect structure is also configurable to accommodate various signal, power, and reference plane connection arrangements of a package substrate and its associated PCB, which improves manufacturability and reliability of the connections formed between the package substrate and PCB. Additionally, by eliminating the use of solder balls, the conductive columns can be arranged to fit a greater number of connections into a given interface area between the package substrate and PCB. The greater density of connections facilitates decreasing package body size, as well as reducing cost. The interconnect structure achieves all pins simultaneously, and saves time over serial placement of solder balls. Finally, in embodiments with a large contact area between the package substrate and the interconnect structure, an improved thermal path is provided through the interconnect structure into the PCB.

Example Embodiments

FIG. 1-12 illustrate various example steps for fabricating an interconnect structure of the present disclosure. Each top-down view has an associated cross-sectional view, provided at the intersection line in the top-down view. It is noted that other steps may be utilized in addition to, or in the alternative for, various disclosed steps for fabricating an interconnect structure, where the disclosed steps are not limiting. It is also noted that the terms "top" and "bottom" as used herein indicate opposing directions or orientations, where "top" generally indicates elements oriented toward the top of the page in a cross-sectional view and out of the page in a top-down view, and "bottom" generally indicates elements oriented toward the bottom of the page in a cross-sectional view and into the page in a top-down view.

Figure 2:
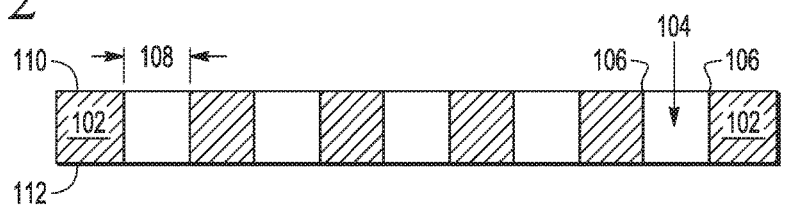

FIG. 1 depicts a top-down view and FIG. 2 depicts a cross-sectional view of a conductive sheet 102 that includes a number of through holes 104. Conductive sheet 102 has a top surface 110 and an opposing bottom surface 112, where the top and bottom surfaces 110 and 112 (and other pairs of top and bottom surfaces) may also be referred to interchangeably as a first major surface and a second major surface that oppose one another. Conductive sheet 102 has a thickness measured between the top and bottom surfaces 110 and 112, where the thickness is comparable to the typical height of solder balls used in BGA or LGA devices. Example values of the conductive sheet thickness fall in the range of 75 to 800 microns, inclusive. One preferred example range includes 100 to 400 microns, inclusive.

Each through hole 104 extends through the conductive sheet 102 from the top surface 110 to the bottom surface 112. Each through hole 104 may also be referred to as a void or absence of the conductive material within the conductive sheet 102. Each through hole 104 has a perimeter 106 that forms an edge within the conductive sheet 102, where the conductive sheet 102 has an internal sidewall at the perimeter 106. It is noted that perimeter 106 is shown as circular in this embodiment (giving the conductive sheet 102 a cylindrical internal sidewall), although different shapes may be implemented in other embodiments. Each through hole 104 has a diameter or width 108 that is large enough or wide enough to accommodate a conductive column and surrounding isolation structure, as further discussed below. Example values of diameter 108 fall in the range of 250 to 800 microns, inclusive. One preferred example range includes 250 to 500 microns, inclusive.

The conductive sheet 102 is formed from an electrically conductive material, examples of which include but are not limited to copper, aluminum, a suitable conductive metal, an alloy or composite of one or more suitable conductive metals, and the like. To improve solderability of the conductive material, the conductive sheet 102 may be coated with a wettable coating that includes another conductive material, examples of which include but are not limited to nickel, gold, copper, a suitable conductive metal, an alloy or composite of one or more suitable conductive metals, and the like. It is noted that the portions of conductive sheet 102 intersected by line 2 in FIG. 1 are shown with cross-hatching in FIG. 2, while each through hole 104 (or absence of portions of conductive sheet 102 on the intersection line 2) is shown as white space.

Figure 3:
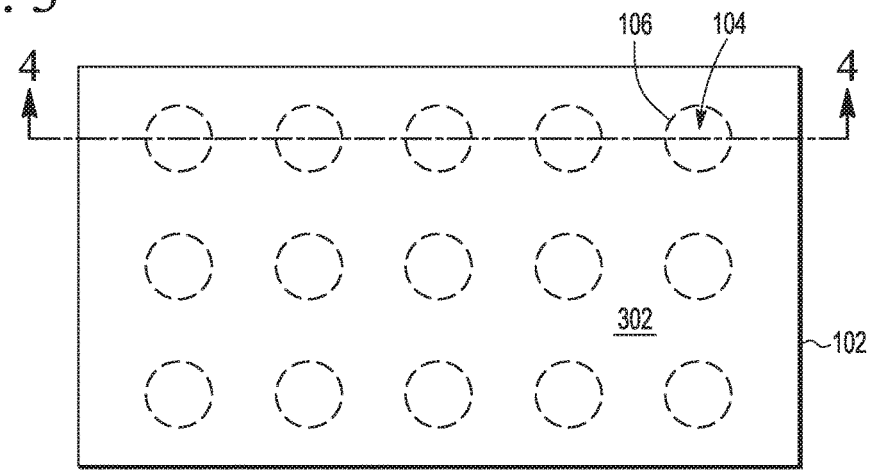
Figure 4:
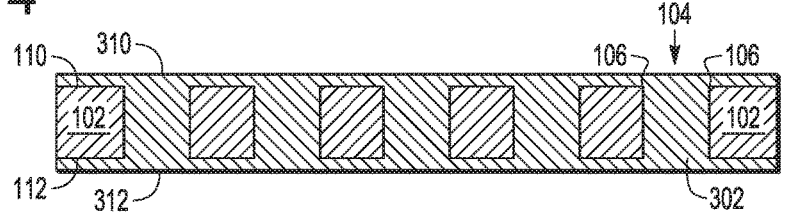

FIG. 3 depicts a top-down view and FIG. 4 depicts a cross-sectional view of conductive sheet 102 after dielectric material 302 is formed over both top and bottom surfaces 110 and 112 of conductive sheet 102 and fills in each through hole 104. Dielectric material 302 has a top surface 310 and a bottom surface 312. Each perimeter 106 of through holes 104 under dielectric material 302 are illustrated in FIG. 3 with circles having broken lines. In some embodiments, dielectric material 302 is deposited over a first surface of conductive sheet 102 to fill in through holes 104 and coat the first surface, which is then flipped and additional dielectric material 302 is deposited over a second surface of conductive sheet 102 to coat the second surface (as well as complete filling any through holes 104, if needed). In other embodiments, dielectric material 302 is injected to coat both surfaces of conductive sheet 102 and fill through holes 104, while in still other embodiments conductive sheet 102 may be dipped in dielectric material 302 to coat both surfaces of conductive sheet 102 and fill through holes 104. In other embodiments, dielectric material 302 may also be formed over the edges of conductive sheet 102 like that shown in FIG. 24, as further discussed below.

Dielectric material 302 is a material that has electrical insulating properties, examples of which include but are not limited to epoxy resins, B-stage materials in a partially cured stage that become fully cured in response to UV (ultraviolet light) exposure or curing temperature, or a combination of suitable insulating materials. For example, an epoxy resin may be utilized to fill the through holes 104, while a B-stage material may be utilized to coat the top and bottom surfaces 110 and 112. It is noted a portion of dielectric material 302 intersected by line 4 in FIG. 3 is shown with additional cross-hatching in FIG. 4.

Figure 5:
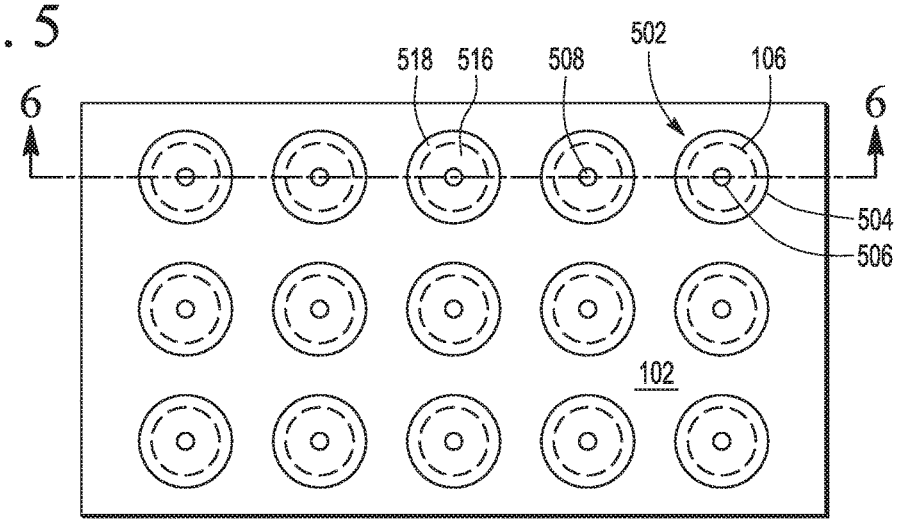
Figure 6:
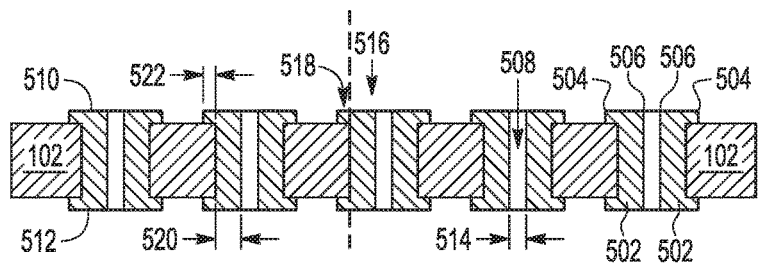

FIG. 5 depicts a top-down view and FIG. 6 depicts a cross-sectional view of conductive sheet 102 after portions of dielectric material 302 are removed from the conductive sheet 102 by a dielectric patterning process. Before the dielectric patterning process, each through hole 104 contains a column of dielectric material 302. The dielectric patterning process creates a hole through a center region of the column of dielectric material 302, forming a center opening 508. The resulting dielectric structure within the through hole 104 is referred to as an isolation structure 502. The center opening 508 may also be referred to as a void or absence of dielectric material 302 within the isolation structure 502. Each center opening 508 extends from a top surface 510 to a bottom surface 512 of isolation structure 502. In some embodiments, surfaces 510 and 512 are equivalent to original surfaces 310 and 312 of the dielectric material 302 before the dielectric patterning process. It is preferred that the center opening 508 be substantially centered within each through hole 104, although some misalignment due to process variations may occur.

Each center opening 508 has a perimeter 506 that forms an edge within the isolation structure 502, where the isolation structure has an internal sidewall at the perimeter 506. It is noted that perimeter 506 is shown as circular in this embodiment (giving the isolation structure 502 a cylindrical internal sidewall), although different shapes may be implemented in the other embodiments. Each center opening 508 has a diameter or width 514 within which a conductive column for a signal or power connection is formed, as further discussed below. Example values of diameter 514 fall within the range of 75 to 200 microns, inclusive. One preferred range includes 100 to 200 microns, inclusive The isolation structure 502 fills an annular region or area between the (inner) perimeter 506 of the center opening 508 and the (outer) perimeter 106 of the through hole 104. This portion of the isolation structure 502 may also be referred to as a sheath portion 516, which in this embodiment has a hollow cylindrical or tubular shape, although may be differently shaped in other embodiments depending on the shapes of the perimeters 506 and 106.

Additionally, portions of dielectric material 302 are selectively removed from both top and bottom surfaces 110 and 112 of conductive sheet 102 to expose an electrical contact area on the surfaces 110 and 112 between the isolation structures 502, also referred to as an interstitial area. In the embodiment shown, the electrical contact area spans substantially the entire interstitial area on surfaces 110 and 112. Other embodiments use openings in the dielectric material 302 to define smaller electrical contact areas in portions of the interstitial area on the surfaces 110 and 112, as discussed below in connection with FIG. 21-24. As discussed below, a reference plane voltage (such as ground) is provided to the conductive sheet 102 through the electrical contact areas defined on the surfaces 110 and 112. The electrical contact areas may also be extended away from the surfaces 110 and 112, as discussed below in connection with FIG. 7-10. The electrical contact areas may also be further defined by a solder mask, examples of which are discussed below in connection with FIG. 27-30.

The removal of portions of dielectric material 302 from top and bottom surfaces 110 and 112 also define the shape of a remaining portion of dielectric material 302 around each through hole 104, which is also part of the isolation structures 502. In the embodiment shown, each isolation structure 502 also includes a ring portion 518 that extends out from perimeter 106 to an outer perimeter 504, covering a portion of the top (and bottom) surface 110 (and 112) of conductive sheet 102. As shown, ring portion 518 has a width 522 that is smaller than the width 520 of the sheath portion 516, although in other embodiments width 522 may be equal to or greater than width 520. It is noted that perimeter 504 is shown as circular in this embodiment, although different shapes may be implemented in other embodiments. The size and shape of perimeter 504 of each isolation structure 502 in turn affects the size and shape of the electrical contact areas in the interstitial area on the top and bottom surfaces of the conductive sheet 102. In the embodiment shown, the ring portion 518 generally remains within the vicinity of (or close to) the sheath portion 516 to provide a larger electrical contact area in the interstitial area between the isolation structures 502. Smaller electrical contact areas may be defined by using smaller openings in a layer of dielectric material on the top and bottom surfaces 110 and 112 of conductive sheet 102, as discussed below in connection with FIG. 21-24.

The dielectric patterning process may utilize photolithography for depositing and patterning a photolithography mask or other photoresist materials to protect targeted portions of the dielectric material 302, an etching process that utilizes a wet etchant or a dry etchant to remove unprotected portions of the dielectric material 302, and removing the photolithography mask or other photoresist materials. In some embodiments, the dielectric patterning process includes drilling, lasering, or otherwise creating the center opening 508 of the isolation structure 502.

Figure 7:
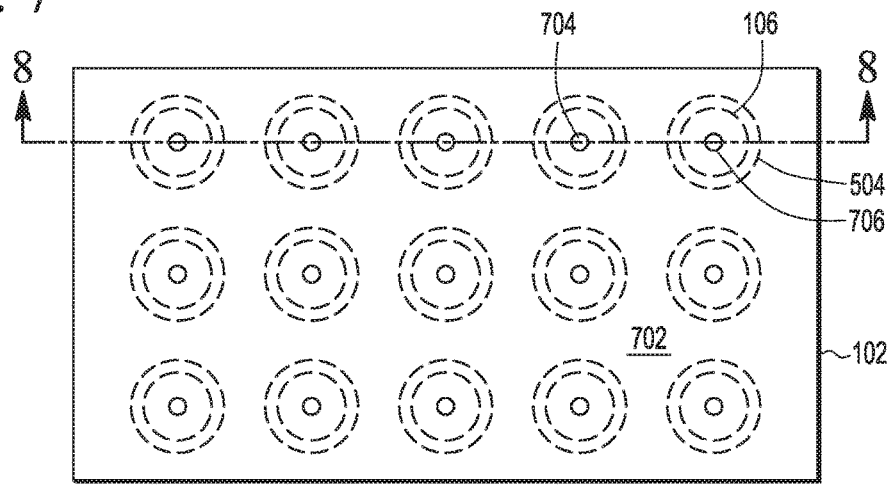
Figure 8:
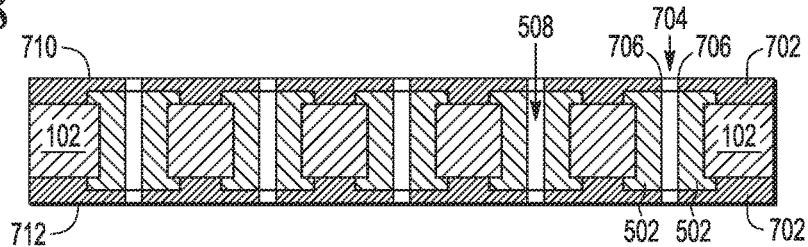

FIG. 7 depicts a top-down view and FIG. 8 depicts a cross-sectional view of conductive sheet 102 after a mask 702 is deposited and patterned on both surfaces of conductive sheet 102. A top mask 702 has a top surface 710 that covers exposed portions of the top surface 110 of conductive sheet 102 and the top surface 510 of each isolation structure 502, and a bottom mask 702 has a bottom surface 712 that covers exposed portions of the bottom surface 112 of conductive sheet 102 and bottom surface 512 of each isolation structure 502. Each outer perimeter 504 of isolation structure 502 under mask 702 are illustrated in FIG. 7 with circles having broken lines.

Each mask 702 also includes a number of mask openings 704, each of which are aligned to each center opening 508 of the isolation structures 502. Put another way, each end of center opening 508 has a respective mask opening 704 in the top and bottom mask 702. Each mask opening 704 has a perimeter 706, which is at least as large as the perimeter 506 of center opening 508. In some embodiments, perimeter 706 has a same shape as perimeter 506, while perimeter 706 may have a different shape than perimeter 506 in other embodiments.

In the embodiment shown, each mask opening 704 is matched to each center opening 508, where a perimeter 706 of the mask opening 704 substantially matches or overlays the perimeter 506 of center opening 508. In other embodiments, each mask opening 704 may have a perimeter 706 that is larger than the perimeter 506 of the center opening 508, or perimeter 706 may be both larger and differently shaped than perimeter 506, to form larger ends for electrical contact areas of the conductive columns, as discussed below in connection with FIG. 27-30.

In other embodiments, each mask 702 also includes additional openings that are aligned to openings in the dielectric material over the conductive sheet 102 (e.g., openings 2106) that define electrical contact areas of the conductive sheet 102, such as those shown in FIG. 21-24. In still other embodiments, each mask 702 also includes additional openings over portions of surfaces 110 and 112 of the conductive sheet 102 in the interstitial area, in order to define electrical contact areas of the conductive sheet 102 without requiring dielectric material to define the electrical contact areas, as discussed below in connection with FIG. 9-10.

Mask 702 is formed from a photoresistive material, using photolithography to deposit and pattern the photoresist material into mask 702, which protects at least portions of the conductive sheet 102 and isolation structures 502. It is noted that the portions of mask 702 intersected by line 8 in FIG. 7 are shown with cross-hatching in FIG. 8, while each through mask opening 704 (or absence of portions of mask 702 on the intersection line 8) is shown as white space.

Figure 9:
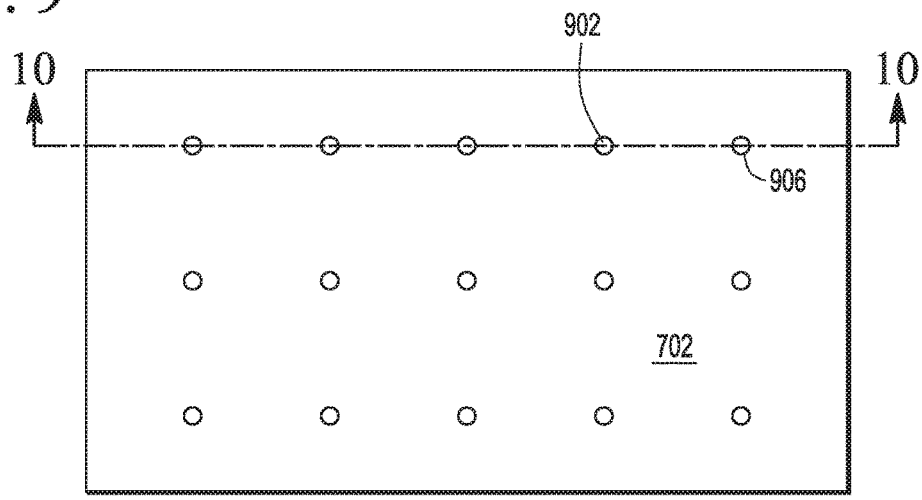
Figure 10:
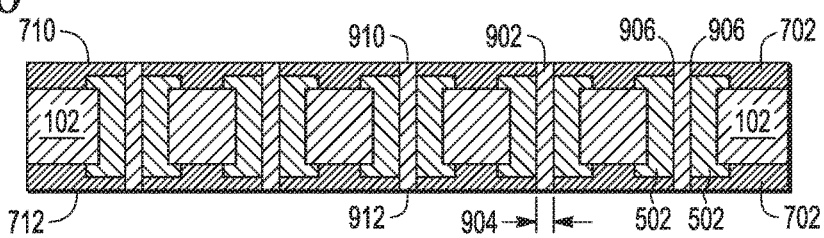

FIG. 9 depicts a top-down view and FIG. 10 depicts a cross-sectional view of conductive sheet 102 after conductive columns 902 have been formed. A conductive column 902 is formed within each center opening 508, extending from a top surface 910 that is substantially equivalent to the top surface 710 of the mask 702 to a bottom surface 912 that is substantially equivalent to the bottom surface 712 of the opposing mask 702. Each conductive column 902 has a perimeter 906 that is defined by the inner perimeter 506 of isolation structure 502, and by perimeter 706 of the mask openings 704 in the top and bottom mask 702. For simplicity's sake, the perimeters 106 and 504 underlying mask 702 are not illustrated in FIG. 9. Each conductive column 902 has a diameter or width 904, which is preferred to be a consistent size for the entire length of the conductive column 902, at least within the extent of the isolation structure 502. Conductive columns 902 are formed from an electrically conductive material, examples of which include but are not limited to copper, gold, tin, a suitable conductive metal, an alloy or composite of one or more suitable conductive metals, solder in various forms (such as solder paste), and the like. The conductive columns 902 may be formed using a suitable process to fill the central opening with the conductive material, such as electroless plating, electrolytic plating, screen printing, and the like.

In embodiments where each mask opening 704 has a (circular) perimeter 706 that is larger than the perimeter 506 of the center opening 508, the resulting conductive columns 902 have a disk portion of conductive material on each end, extending from the (inner) perimeter 906 to the (outer) perimeter 706 delineated by the mask opening 704. For example, the disk portions may be formed by plating additional conductive material within each larger perimeter 706 over the ends of the conductive columns 902. The exposed top and bottom surfaces 910 and 912 of the disk portion form larger electrical contact areas for the conductive columns 902, which are wider than the width 904 of the conductive columns 902. The disk portion may also be referred to as an extended electrical contact area, and may provide a structurally robust electrical contact area on which to form an external connection. Examples of such a resulting extended electrical contact area (e.g., layers 2714 or 2914) are illustrated in FIG. 27-30, as further discussed below.

In embodiments where each mask includes additional openings over the conductive sheet 102 in the interstitial area, additional conductive material may be formed within the additional mask openings to form extended electrical contact areas for the conductive sheet 102. For example, the extended electrical contact areas may be formed by plating additional conductive material over the exposed top and bottom surfaces of conductive sheet 102 within each additional mask opening. The extended electrical contact areas extend beyond the top and bottom surfaces 110 and 112 of the conductive sheet 102 in a manner like surfaces 910 and 912 of the conductive columns 902. The extended electrical contact areas may provide a structurally robust electrical contact area on which to form an external connection. Examples of such a resulting extended electrical contact area (e.g., layers 2716 or 2916) are also illustrated in FIG. 27-30.

The process used to fill the central openings 508 with conductive material may also be used to form the disk portion on each end of the conductive columns 902, the extended electrical contact area on the conductive sheet 102, or both. The thickness or height of the disk portions and of the extended electrical contact area may be substantially similar if a single formation process is utilized, or may be different if separate formation processes are used to form the disk portions and the extended electrical contact areas. The disk portions may be coplanar with one another, and the extended electrical contact areas may be coplanar with one another. The surfaces of the disk portions in relation to the surfaces of the extended electrical contact areas may not be coplanar with one another, depending on the process used to form the disk portions and the extended electrical contact areas.

Figure 11:
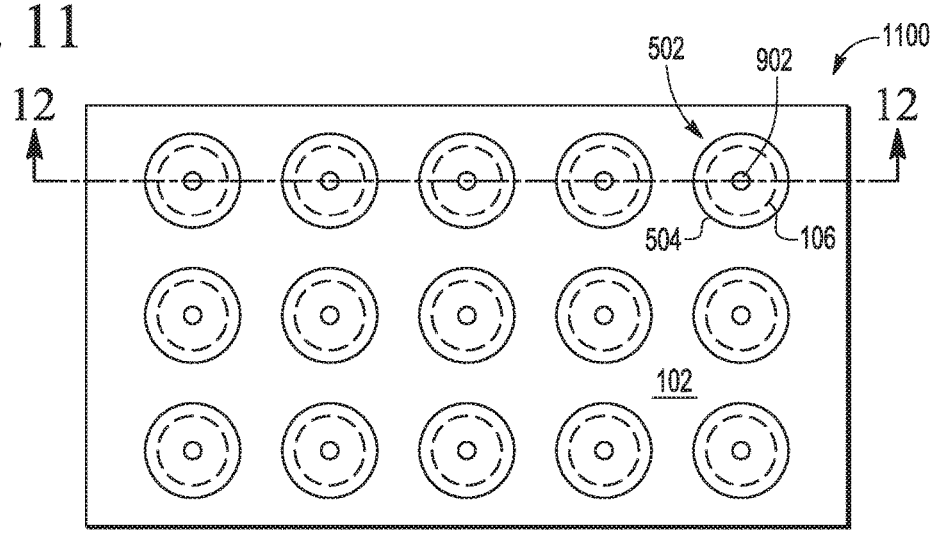
Figure 12:
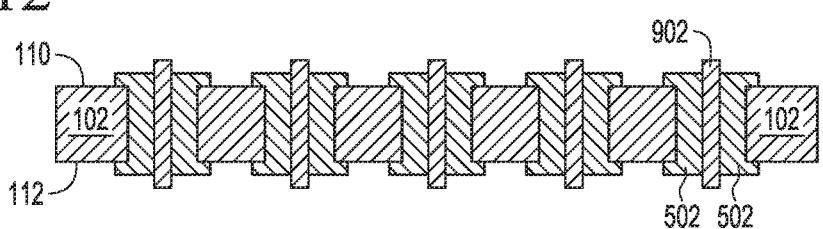

FIG. 11 depicts a top-down view and FIG. 12 depicts a cross-sectional view of conductive sheet 102 after mask 702 is removed, resulting in an interconnect structure 1100 with exposed top and bottom surfaces of the isolation structures 502 and exposed portions of the top and bottom surfaces of the conductive sheet 102. In the embodiment shown, the resulting structure includes conductive columns 902 having top and bottom surfaces 910 and 912 that extend beyond top and bottom surfaces 510 and 512 of each isolation structure 502, and isolation structures 502 having top and bottom surfaces 510 and 512 that extend beyond the top and bottom surfaces 110 and 112 of conductive sheet 102. The exposed top and bottom surfaces 910 and 912 of the conductive columns 902 form electrical contact areas. Each isolation structure 502 laterally separates and electrically isolates conductive columns 902 from conductive sheet 102.

In other embodiments, the disk portion of the conductive columns 902, the extended electrical contact areas of the conductive sheet 102, or both, may be formed during a subsequent contact area formation process applied to interconnect structure 1100. This formation process may utilize additional photolithography for depositing and patterning a photolithography mask or other photoresist material to define mask openings for the contact areas over the conductive columns 902, over the conductive sheet 102, or both. Additional conductive material may then be plated or otherwise formed within the mask openings to form the disk portions at each end of conductive columns 902, to form the extended electrical contact areas on the surfaces 110 and 112 of conductive sheet 102, or both. The mask may then be removed. Such a process may continuation with planarization, like that discussed in connection with FIGS. 13 and 14 below.

Figure 13:
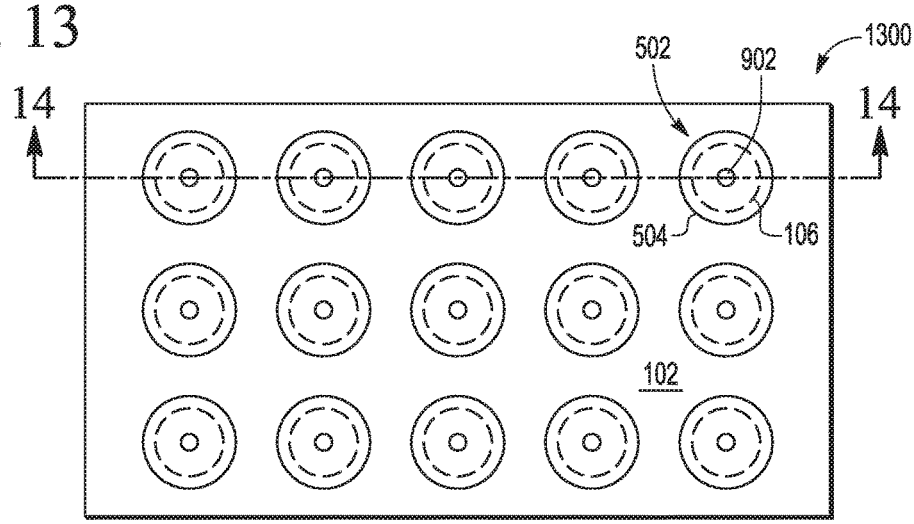
FIGS. 13-24 and 27-30 illustrate block diagrams depicting top-down and side views of various example embodiments of an interconnect structure of the present disclosure.
Figure 14:
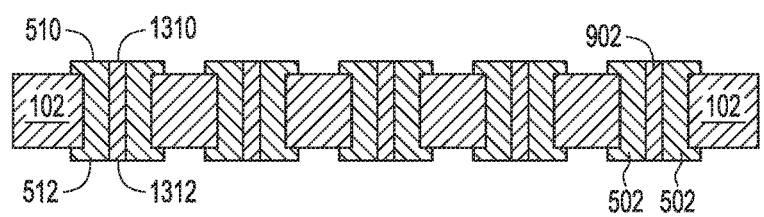

FIG. 13 depicts a top-down view and FIG. 14 depicts a cross-sectional view of conductive sheet 102 after planarization is performed on interconnect structure 1100, resulting in an interconnect structure 1300. In the embodiment shown, planarization removes a portion of each conductive column 902 that extends beyond surfaces 510 and 512 of isolation structures 502, resulting in top and bottom surfaces 1310 and 1312 of each conductive column 902 that are coplanar with surfaces 510 and 512 of isolation structures 502. The exposed top and bottom surfaces 1310 and 1312 of the conductive columns 902 form electrical contact areas. Examples of planarization may include but are not limited to chemical mechanical polishing or planarization using a slurry.

In embodiments where each conductive column 902 has a disk portion of conductive material on each end, the exposed top and bottom surfaces 910 and 912 of the disk portion may be planarized to improve coplanarity of the top and bottom surfaces 910 and 912. The resulting planarized structure has top and bottom surfaces 910 and 912 that continue to extend beyond top and bottom surfaces 510 and 512 of isolation structures 502. In embodiments where extended electrical contact areas are provided in the interstitial area, the extended electrical contact areas may or may not be planarized, which may depend on the resulting height of the extended electrical contact areas.

Figure 15:
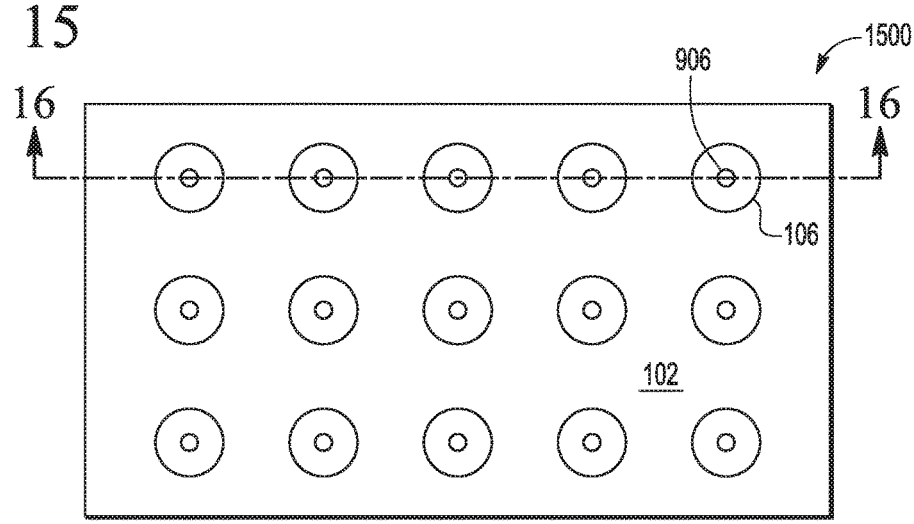
Figure 16:
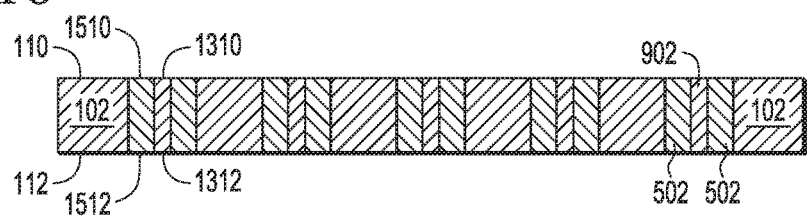

FIG. 15 depicts a top-down view and FIG. 16 depicts a cross-sectional view of conductive sheet 102 after planarization is performed on interconnect structure 1100 (or additional planarization is performed on interconnect structure 1300), resulting in an alternative interconnect structure 1500. In the embodiment shown, planarization removes a portion of each conductive column 902 and each isolation structure 502 that extends beyond surfaces 110 and 112 of conductive sheet 102. As a result, top and bottom surfaces 1510 and 1512 of isolation structure 502 and top and bottom surfaces 1310 and 1312 of conductive column 902 are coplanar with top and bottom surfaces 110 and 112 of conductive sheet 102. The exposed top and bottom surfaces 1310 and 1312 of the conductive columns 902 form electrical contact areas. It is noted that the planarization performed in FIGS. 15 and 16 exposes a larger surface area of the top and bottom surfaces conductive sheet 102 than the planarization performed in FIGS. 13 and 14, which may be utilized to define larger electrical contact areas for conductive sheet 102.

It is noted that in alternative embodiments, the structure shown in FIGS. 3 and 4 may have center openings 508 drilled through dielectric material 302 within each through hole 104 without removing any dielectric material 302 from the top and bottom surfaces 110 and 112 of conductive sheet 102. The process may then proceed directly to forming conductive columns 902 in each center opening 508, and then planarizing the conductive columns 902 and dielectric material 302 to become coplanar with the top and bottom surfaces 110 and 112 of conductive sheet 102, resulting in an interconnect structure like that shown in FIGS. 15 and 16.

In other embodiments, one or more through holes 104 are dedicated for a reference plane connection to the conductive sheet 102 (rather than exposing the surface of the conductive sheet), where the dedicated through holes 104 would have the dielectric material 302 completely removed from within the dedicated through holes 104. The dedicated through holes 104 would only include a conductive column 902 (and would not include the isolation structure 502) for a direct "internal" electrical connection to the conductive sheet 102, meaning that the dedicated through holes 104 may have a smaller diameter (large enough to accommodate only the conductive column 902) than the remaining through holes 104 (which are large enough to accommodate both the conductive column 902 and the isolation structure 502).

In other embodiments, the dielectric material 302 may remain over both top and bottom surfaces (and over the edges in some embodiments) of the conductive sheet 102 without any dedicated through holes 104 for a reference plane connection to the conductive sheet, leaving the conductive sheet in a floating state.

Figure 17:
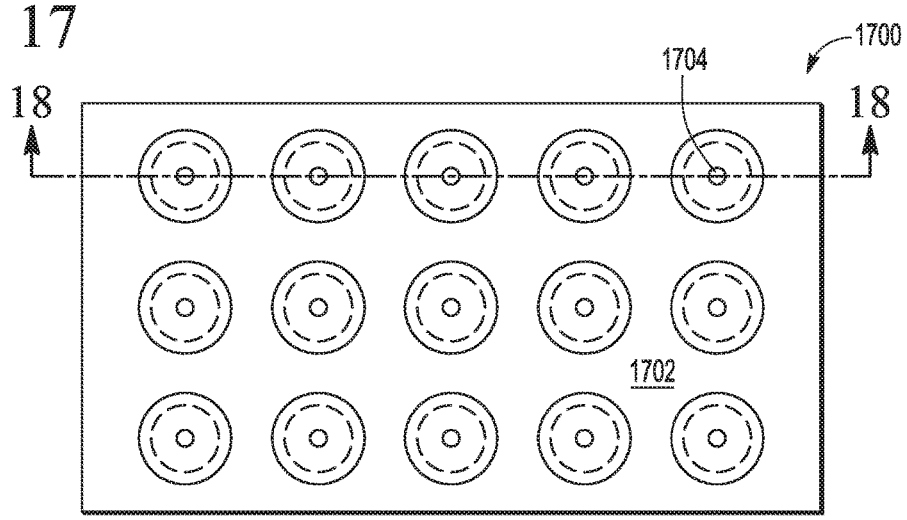
Figure 18:
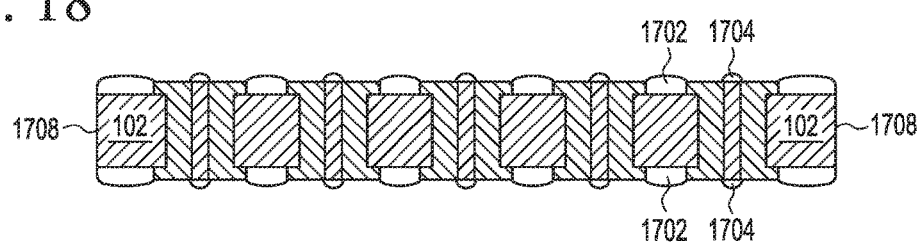
Figure 24:
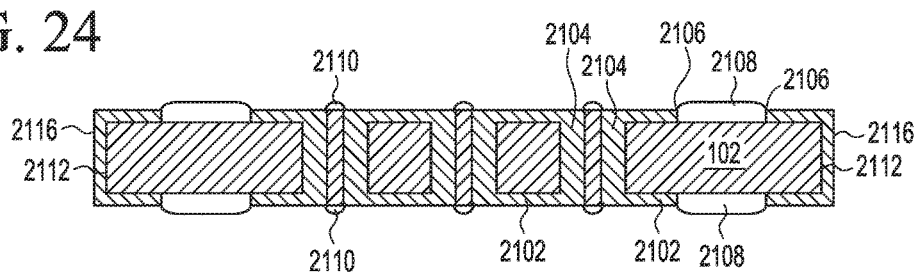

FIG. 17 depicts a top-down view and FIG. 18 depicts a cross-sectional view of conductive sheet 102 after the addition of solder material to electrical contact areas of interconnect structure 1300, resulting in an interconnect structure 1700. In the embodiment shown, solder deposits 1702 are placed or formed on the entirety of exposed portions of surfaces 110 and 112 of conductive sheet 102 between the isolation structures 502. Solder deposits 1702 form external electrical connections to the conductive sheet 102. Solder deposits 1704 are also placed or formed on exposed top and bottom surfaces 1310 and 1312 of conductive columns 902, also forming external electrical connections to the conductive columns 902. In other words, each conductive column 902 has a solder deposit 1704 at each end to form an external electrical connection at both ends of the conductive column 902. The ring portions 518 and sheath portions 516 of each isolation structure 502 laterally separate and electrically isolate the solder deposits 1702 from solder deposits 1704. While the sides 1708 of the conductive sheet 102 are exposed in the embodiment shown, the sides 1708 may be covered with dielectric in other embodiments, as shown in FIG. 24.

Solder deposits, like 1702 and 1704, are formed from solder material, such as solder paste or solder preforms. The solder deposits may be placed or formed by a suitable process, such as screen printing, placing preforms, sputtering, and the like. In some embodiments, a wettable coating may be deposited on the exposed top and bottom surfaces of conductive columns 902, on exposed portions of surfaces 110 and 112 of conductive sheet 102, or both, before solder deposits 1702 and 1704 are formed. It is noted that the amount of solder material used to form solder deposits 1702 may be greater than the amount of solder material used to form solder deposits 1704 in order to achieve coplanar external electrical connections for attachment to semiconductor devices, as further discussed below in connection with FIGS. 25 and 26.

In other embodiments, additional conductive material, such as a layer of copper, may be formed on the exposed top and bottom surfaces of conductive columns 902, on exposed portions of surfaces 110 and 112 of conductive sheet 102, or both, before solder deposits 1702 and 1704 are formed to improve the robustness of the connections. Such embodiments are further discussed below in connection with FIG. 27-30.

Figure 19:
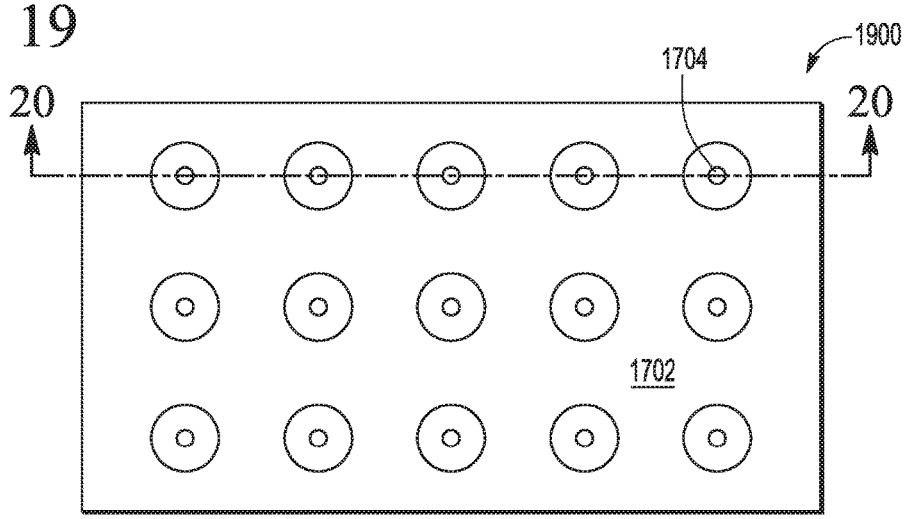
Figure 20:
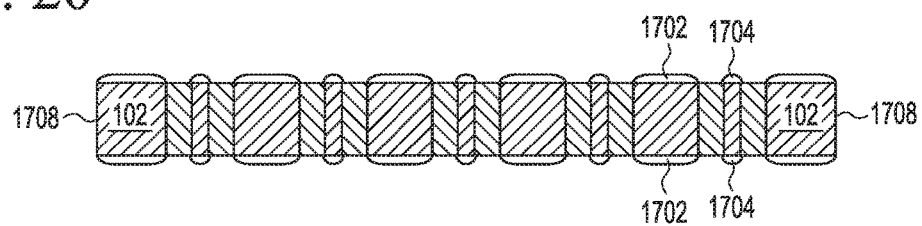

FIG. 19 depicts a top-down view and FIG. 20 depicts a cross-sectional view of conductive sheet 102 after the addition of solder material to electrical contact areas of interconnect structure 1500, resulting in an interconnect structure 1900. As similarly discussed above in connection with FIGS. 17 and 18, solder deposits 1702 form external electrical connections to the conductive sheet 102 and solder deposits 1704 form external electrical connections to the conductive columns 902, with the sheath portion 516 of isolation structures 502 laterally separating and electrically isolating the solder deposits 1702 from solder deposits 1704. It is noted that since the exposed surfaces of the conductive columns 902 and conductive sheet 102 are coplanar, less solder material may be needed to achieve coplanar external electrical connections, as compared with interconnect structure 1700. However, the solder material is still formed over the entirety of the exposed portions of surfaces 110 and 112 of conductive sheet 102. In other embodiments, additional conductive material may also be formed on the exposed top and bottom surfaces of conductive columns 902, on exposed portions of surfaces 110 and 112 of conductive sheet 102, or both, before solder deposits 1702 and 1704 are formed, as discussed below in connection with FIG. 27-30.

Figure 21:
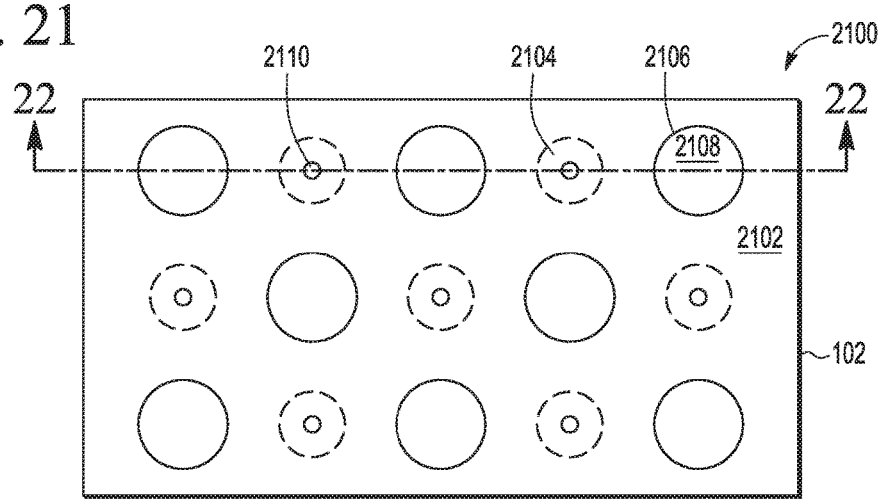
Figure 22:
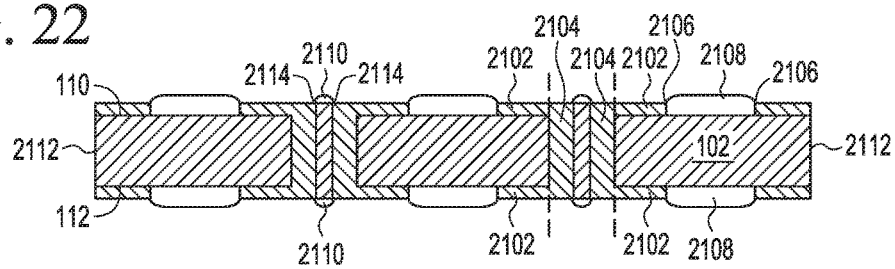

FIG. 21 depicts a top-down view and FIG. 22 depicts a cross-sectional view of another embodiment of an interconnect structure 2100. In the embodiment shown, isolation structures 2104 (also referred to as sheath portions 2104) each have a center opening 2114 in which a conductive column 902 is formed, where the isolation structure 2104 surrounds each conductive column 902. Solder deposits 2110 are formed on or joined to surfaces of the conductive column 902 exposed within the openings 2114 in the top surface of isolation structures 2104. An extended portion or layer 2102 of dielectric material spans across the top and bottom surfaces 110 and 112 of conductive sheet 102, as opposed to being limited or patterned to remain close to the vicinity of the sheath portion 2104 (like the ring portions 518 and sheath portions 516 illustrated in FIGS. 5 and 6). A number of openings 2106 are formed in the layer 2102 to expose portions of the top and bottom surfaces 110 and 112 of conductive sheet 102 to define electrical contact areas. Solder deposits 2108 are formed on or joined to the conductive sheet 102 within each opening 2106 to form external electrical connections to the conductive sheet 102. In this manner, the size of the external electrical connections to conductive sheet 102 can be controlled, which reduces the amount of solder needed to form the external electrical connections to the conductive sheet 102 (as opposed to covering the entirety of exposed portions of the top and bottom surfaces 110 and 112 of conductive sheet 102). While the sides 2112 of the conductive sheet 102 are exposed in the embodiment shown, the sides 2112 may be covered with dielectric in other embodiments, as similarly shown in FIG. 24. In other embodiments, additional conductive material may also be formed within openings 2106, on the exposed top and bottom surfaces of conductive columns 902, or both, before solder deposits 2108 and 2110 are formed, as discussed below in connection with FIG. 27-30.

Figure 23:
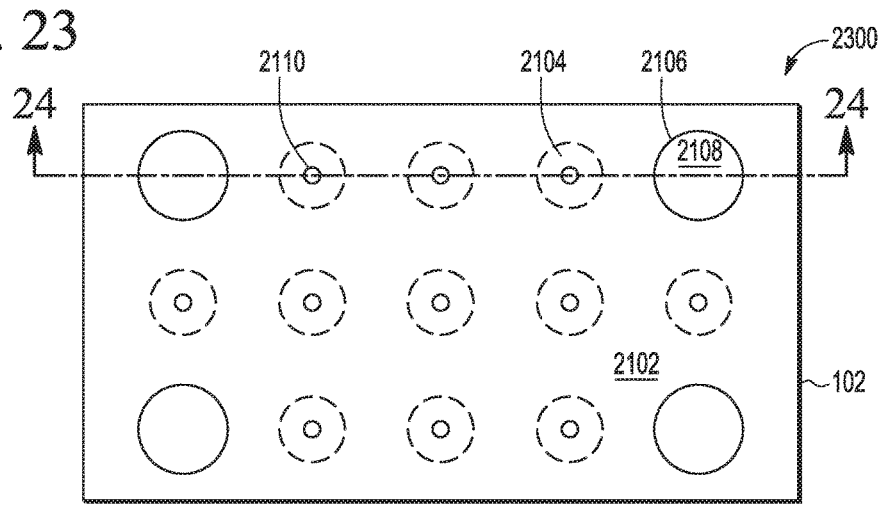

FIG. 23 depicts a top-down view and FIG. 24 depicts a cross-sectional view of another embodiment of an interconnect structure 2300. As similarly discussed above in connection with FIGS. 21 and 22, solder deposits 2110 are formed on or joined to surfaces of conductive columns 902 within openings 2114, solder deposits 2108 are formed on or joined to exposed portions of top and bottom surfaces of conductive sheet 102 within openings 2106, where isolation structures 2104 and layer 2102 laterally separate and electrically isolate solder deposits 2110 from solder deposits 2108. Sides 2112 of the conductive sheet 102 are covered with dielectric material 2116. In other embodiments, additional conductive material may also be formed within openings 2106, on the exposed top and bottom surfaces of conductive columns 902, or both, before solder deposits 2108 and 2110 are formed, as discussed below in connection with FIG. 27-30.

Figure 27:
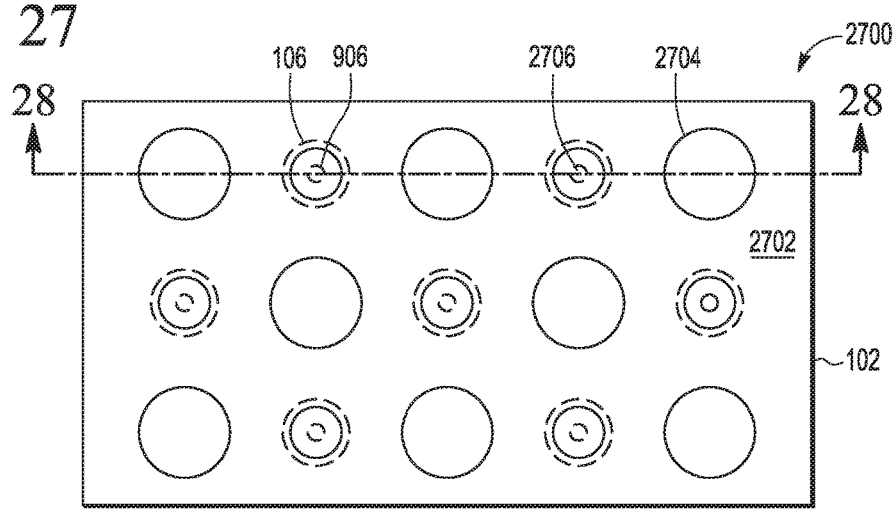
Figure 28:
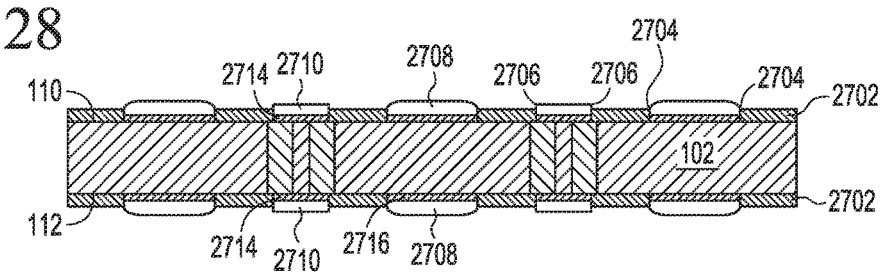

FIG. 27 depicts a top-down view and FIG. 28 depicts a cross-sectional view of another embodiment of an interconnect structure 2700. Interconnect structure 2700 shows an embodiment having optional extended electrical contact areas for the conductive columns 902, conductive sheet 102, or both. The extended electrical contact areas are formed from a layer of additional conductive material (also referred to as a conductive layer), such as copper, that is formed on portions of top and bottom surfaces 110 and 112 of conductive sheet 102, on either end of conductive columns 902, and on at least part of top and bottom surfaces 510 and 512 of isolation structure 502. The perimeter 906 of the conductive column 902 under conductive layer 2714 is shown as a circle with a broken line. The conductive layers, such as conductive layers 2714 and 2716, may be formed using a suitable process, which may include electroless plating, electrolytic plating, and the like. The conductive layers may be formed during formation of the conductive columns 902 (similar to the process described above), or may be formed during a subsequent formation process, where the conductive layers may be formed using a single process or separate processes.

In some embodiments, layer 2702 is a layer of dielectric material having openings 2704 and 2706 in which conductive layers 2714 and 2716 are formed. The width of conductive layer 2714 (which corresponds to the width of opening 2706) is larger than the width 904 of the conductive columns 902, providing a larger electrical contact area for external connections. Similarly, the width of conductive layer 2716 corresponds to the width of opening 2704 and provides an extended electrical contact area for the conductive sheet 102. Solder deposits 2708 and 2710 are then formed over the conductive layers 2714 and 2716 within each opening 2704 and 2706.

In other embodiments, layer 2702 is an optional solder mask 2702. As shown, top and bottom surfaces of isolation structures 502 and conductive columns 902 are coplanar with top and bottom surfaces 110 and 112 of the conductive sheet 102. A top solder mask 2702 covers the top surfaces of the conductive sheet 102 and isolation structures 502, and a bottom solder mask 2702 covers the bottom surfaces of the conductive sheet 102 and isolation structures 502. As shown, each solder mask 2702 has a set of first openings 2706 aligned with the electrical contact areas of the conductive columns 902 and a set of second openings 2704 aligned with the extended electrical contact areas of the conductive sheet 102. The electrical contact areas of the conductive columns 902 and conductive sheet 102 may be solder mask defined (SMD) contact areas or non-solder mask defined (NSMD) contact areas.

In other embodiments without the conductive layers 2714 and 2716 present (such as illustrated interconnect structure 1500), the solder mask openings 2706 may be aligned to an exposed surface 910 of the conductive columns 902 to define electrical contact areas for the conductive columns 902. Similarly, the solder mask openings 2704 may be aligned to a portion of an exposed surface of the conductive sheet 102 to define electrical contact areas for the conductive sheet 102. Solder deposits 2710 and 2708 may then be formed directly on the electrical contact areas (or exposed portions) of the conductive sheet 102 and conductive columns 902 within the solder mask openings 2704 and 2706 to form external electrical connections.

Figure 29:
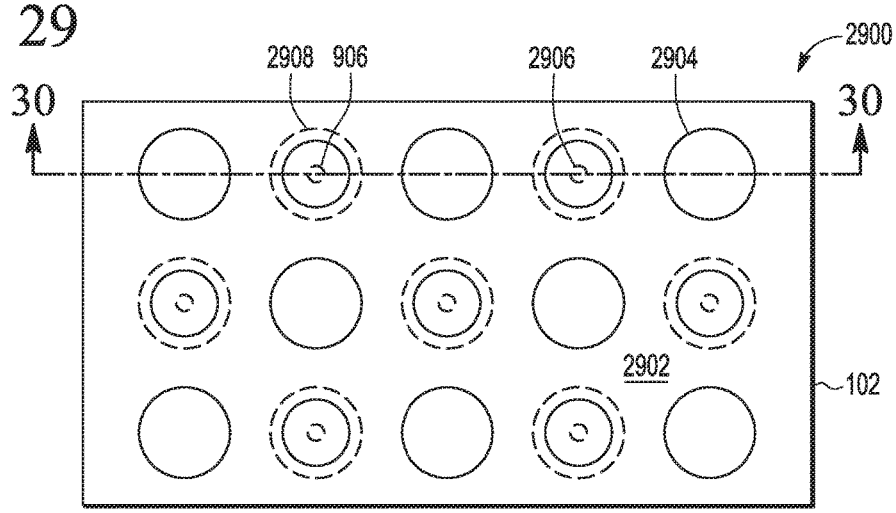
Figure 30:
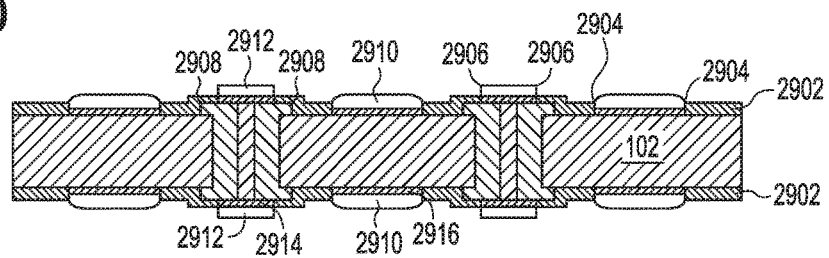

FIG. 29 depicts a top-down view and FIG. 30 depicts a cross-sectional view of another embodiment of an interconnect structure 2900. Interconnect structure 2900 shows an embodiment having optional conductive layers 2914 and 2916, which may be formed as discussed above. Solder deposits 2908 and 2910 are formed over the conductive layers 2914 and 2916.

In some embodiments, layer 2902 is an optional solder mask 2902. As shown, top and bottom surfaces of isolation structures 502 and conductive columns 902 are coplanar, both respectively extending beyond the top and bottom surfaces of conductive sheet 102. The isolation structures 502 include both sheath and ring portions 516 and 518. A top solder mask 2902 is placed over the top surfaces of the conductive sheet 102 and isolation structures 502, and a bottom solder mask 2902 is placed over the bottom surfaces of the conductive sheet 102 and isolation structures 502. The outer perimeter 2908 of the ring portions 516 of the isolation structures 502 under the solder mask 2902 is shown as a circle with a broken line. Each solder mask 2902 has a set of first openings 2906 aligned with the electrical contact areas of the conductive columns 902 and a set of second openings 2904 aligned with the electrical contact areas of the conductive sheet 102. Similarly, the electrical contact areas of the conductive columns 902 and conductive sheet 102 may be SMD or NSMD contact areas.

In other embodiments to without the conductive layers 2914 and 2916 present (such as illustrated interconnect structure 1300), the solder mask openings 2906 and 2904 may be aligned to exposed surfaces of the conductive columns 902 and the conductive sheet 102 to define electrical contact areas within the openings 2906 and 2904. Solder deposits 2910 and 2912 may be formed directly on the electrical contact areas (or exposed portions) of the conductive sheet 102 and conductive columns 902 within the solder mask openings 2904 and 2906 to form external electrical connections.

Figure 25:
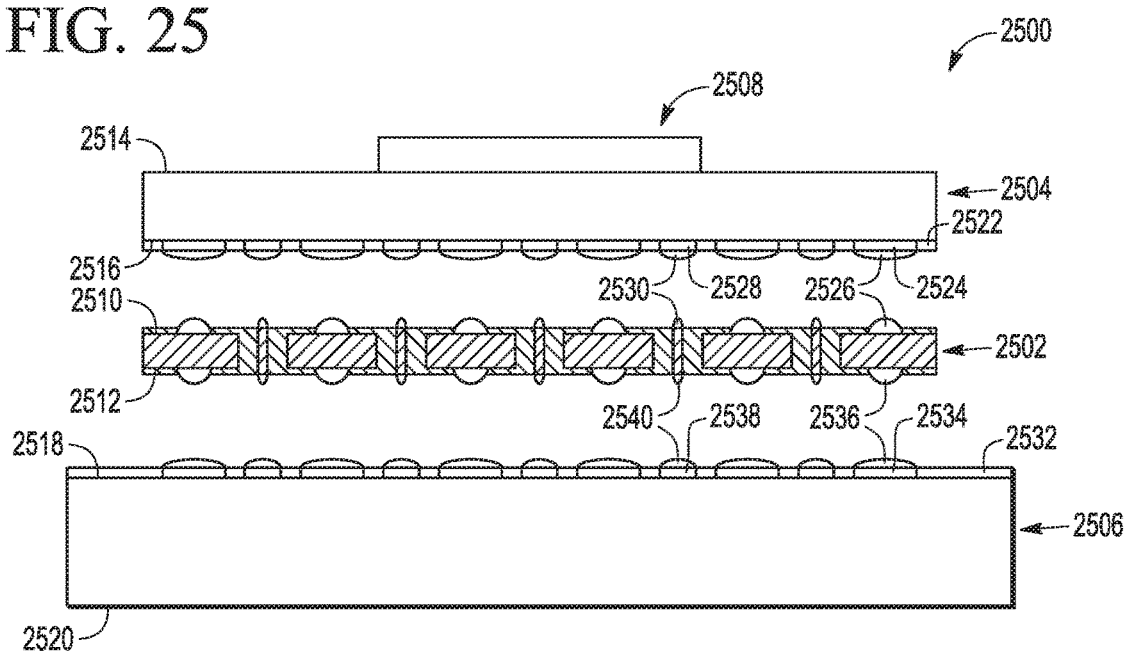
FIG. 25-26 illustrate block diagrams depicting cross-sectional side views of an example interconnect structure in a packaged semiconductor device, according to some embodiments of the present disclosure.

FIG. 25 depicts a cross-sectional view of an example interconnect structure 2502 that is positioned between devices to form interconnections between the devices in a packaged semiconductor device 2500, such as a package substrate 2504 and a printed circuit board 2506. Package substrate 2504 has a first (or active) surface 2516 and a second (or back) surface 2514 opposing the first surface 2516. Package substrate 2504 has a number of signal pads 2528 and a number of reference plane pads 2524 on the first surface 2516. Substrate pads 2528 and 2524 are surrounded by passivation or solder mask 2522, where the substrate pads may be solder mask defined (SMD) pads or non-solder mask defined (NSMD) pads. Rather than placing solder balls on the pads of package substrate 2504, a set of solder deposits 2530 are formed on or joined to signal pads 2528 and a set of solder deposits 2526 are formed on or joined to reference plane pads 2524. Solder deposits, like 2530 and 2526, are formed from solder material, such as solder paste or solder preforms. In some embodiments, a wettable coating may be deposited on the substrate pads before solder deposits 2530 and 2526 are formed. In the embodiment shown, package substrate 2504 has a device 2508 mounted on the second surface 2514, where device 2508 is an integrated circuit.

In some embodiments, the package substrate 2504 is made of a dielectric material with conductive structures, such as plating, pads, interconnects, vias for providing electrical connections from device 2508 on the second surface 2514 to external conductive structures on the first surface 2516. Examples of the package substrate include but are not limited to a ball grid array (BGA), a flip chip BGA, a land grid array (LGA), a flip chip LGA, a chip carrier, and the like. Examples of integrated circuits include but are not limited to: a processor, memory, logic, analog circuitry, sensor, a MEMS device, a system on chip (SoC), a stand-alone discrete device such as a resistor, inductor, capacitor, diode, power transistor, and the like. In some embodiments, device may be a combination of the integrated circuit types listed above or may be another type of microelectronic device. The package substrate and the integrated circuit described herein may be implemented using a semiconductor substrate, which can be any semiconductor material or combinations of materials, such as gallium arsenide, silicon germanium, silicon-on-insulator (SOI), silicon, monocrystalline silicon, the like, and combinations of the above.

Printed circuit board (PCB) 2506 has a first (or active) surface 2518 and a second (or back) surface 2520 opposing the first surface 2518. PCB 2506 has a number of signal pads 2538 on the first surface 2518 that are aligned with substrate signal pads 2528, and a number of reference plane pads 2534 on the first surface 2518 that are aligned with substrate reference plane pads 2524. The PCB pads 2538 and 2534 are surrounded by passivation or solder mask 2532, where the PCB pads may be SMD pads or NSMD pads. A set of solder deposits 2540 are formed on or joined to signal pads 2538 and a set of solder deposits 2536 are formed on or joined to reference plane pads 2534. In some embodiments, a wettable coating may be deposited on the PCB pads before solder deposits 2540 and 2534 are formed. PCB 2506 includes electrically conductive features on a non-conductive substrate. Examples of PCB include but are not limited to a flexible type PCB using polyimide or a rigid type PCB using FR4 or BT resin.

Interconnect structure 2502 is positioned between the first surface 2516 of substrate 2504 and the first surface 2518 of PCB 2506 and is aligned to the pads of substrate 2504 and PCB 2506. Another set of solder deposits 2530 are formed on or joined to a surface of the conductive columns 902 exposed on the first surface 2510 of the interconnect structure 2502, and another set of solder deposits 2526 are formed on or joined to a surface of the conductive sheet 102 exposed on the first surface 2510 of the interconnect structure 2502. Similarly, another set of solder deposits 2540 are formed on or joined to a surface of the conductive columns 902 exposed on the second surface 2512 of the interconnect structure 2502, and another set of solder deposits 2536 are formed on or joined to a surface of the conductive sheet 102 exposed on the second surface 2512 of the interconnect structure 2502.

It is noted that the amount of solder material used to form solder deposits 2526 and 2536 (on the interconnect structure 2502, the substrate 2504, or both) may be respectively greater than the amount of solder material used to form solder deposits 2530 and 2540 (on the interconnect structure 2502, substrate 2504, or both) in order to achieve coplanar external electrical connections for attachment to the substrate 2504 and PCB 2506. As shown, a height of each of the solder deposits 2526 and 2536 measured from the surface of the conductive sheet 102 to the apex of the solder deposit is greater than a height of each of the solder deposits 2530 and 2540 measured from the surface of the conductive column 902 to the apex of the solder deposit. Put another way, the height of the solder deposits 2526 and 2536 are substantially equal to the height of the solder deposits 2530 and 2540 plus the thickness of the layer of dielectric layer over the conductive sheet 102. The apex of each of solder deposits 2526, 2536, 2530, and 2540 are substantially coplanar.

Figure 26:
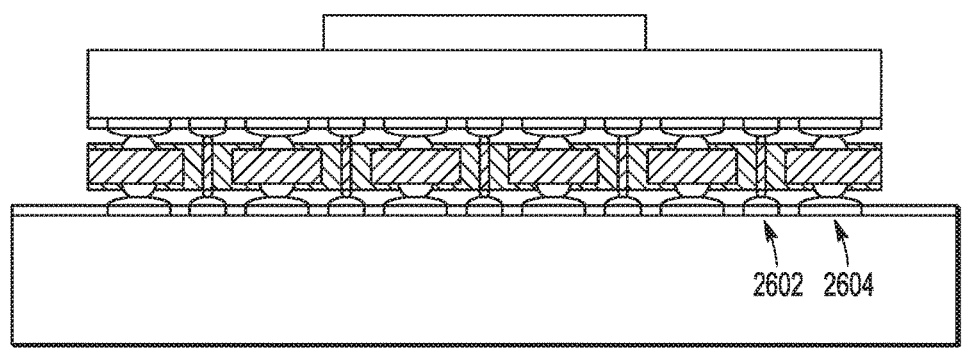

FIG. 26 depicts a cross-sectional view of the resulting packaged semiconductor device 2500 that includes interconnect structure 2502 after solder reflow is performed. In some embodiments, a first solder reflow process joins interconnect structure 2502 to the package substrate 2504 (or to the PCB 2506), and then a second solder reflow process joins the interconnect structure 2502 to the PCB 2506 (or to the substrate 2504). In other embodiments, interconnect structure 2502 is brought into contact with both substrate 2504 and PCB 2506 and a single solder reflow process is performed to join interconnect structure 2502 with both substrate 2504 and PCB 2506. In the embodiment shown, edges of the interconnect structure 2502 are exposed, but may be covered with a dielectric material or other insulating material, such as encapsulant material, in other embodiments.

In the embodiment shown, solder reflow combines solder deposits 2530 to form a solder joint between each conductive column 902 and pads 2528, and combines solder deposits 2540 to form a solder joint between each conductive column 902 and pads 2538. Similarly, solder reflow combines solder deposits 2526 to form a solder joint between the conductive sheet 102 and pads 2524, and combines solder deposits 2536 to form a solder joint between the conductive sheet 102 and pads 2534. The solder joints formed during solder reflow attach the interconnect structure 2502 to both the package substrate 2504 and the PCB 2506. The isolation structures 502 and solder masks 2522 and 2532 act as a gasket during reflow, which prevents shorting during reflow, and acts as an underfill after reflow. After solder reflow, a signal interconnect 2602 is established between each signal pad 2528 of package substrate 2502 and corresponding signal pad 2538 of PCB 2506 through conductive columns 902 of interconnect structure 2502. Similarly, a reference plane interconnect 2604 is established between each reference plane pad 2524 of package substrate 2502 and corresponding reference plane pad 2534 of PCB 2506 through conductive sheet 102 of interconnect structure 2503.

In the embodiment shown, solder deposits 2530 and 2526 are formed on both the interconnect structure 2502 and the pads of substrate 2504. Similarly, solder deposits 2540 and 2536 are formed on both the interconnect structure 2502 and the pads of PCB 2506. In other embodiments, solder deposits 2530, 2526, 2540, and 2536 may be formed only on interconnect structure 2502, where solder reflow joins the solder deposits directly to the corresponding pads on the substrate 2504 and PCB 2506.

In embodiments where a B-stage dielectric material is used in the interconnect structure 2502, the B-stage dielectric material on the top surface 2510 of the interconnect structure 2502 may deform to fill in the space between the interconnect structure 2502 and the substrate 2504 around the solder joint formed on pads 2524 and 2528, as pressure is applied. Similarly, the B-stage dielectric material on the bottom surface 2512 of the interconnect structure 2502 may deform to fill in the space between the interconnect structure 2502 and the PCB 2506 around the solder joint formed on pads 2534 and 2538, as pressure is applied. Once the interconnect structure 2502 is adequately placed between substrate 2504 and PCB 2506, the B-stage dielectric material is cured (such as by curing temperature) during solder reflow, which may also improve attachment of the interconnect structure 2502 to both substrate 2504 and PCB 2506.

While one example embodiment of interconnect structure 2502 is shown positioned between substrate 2504 and PCB 2506 in FIGS. 25 and 26, other embodiments of the interconnect structure may similarly be positioned between substrate 2504 and PCB 2506, such as those shown in FIGS. 18, 20, 22, 24, 28, and 30. In such embodiments, the conductive columns are aligned with signal pads on the substrate 2504 and PCB 2506 and exposed surfaces of conductive sheet 102 are aligned with reference plane pads on the substrate 2504 and PCB 2506.

It is also noted that the openings to expose surfaces of the conductive sheet 102 and openings aligned to the conductive columns 902 (whether the openings are formed in dielectric material or in solder mask) may be arranged to achieve different numbers of signal connections and reference plane connections, as required by the devices connected by the interconnect structure. For a given area, a greater number of signal connections may be achieved by arrangement of the openings, as well as controlling the diameter of the openings to expose the surfaces of the conductive sheet 102.

For example, interconnect structures 2100, 2700, and 2900 each have an arrangement of 7 signal connections with 8 reference plane connections, where each reference plane connection is formed within openings that expose portions of the top and bottom surfaces of the conductive sheet 102. Interconnect structure 2300 has an arrangement of 11 signal connections with 4 reference plane connections, each reference plane connection also formed within openings that expose portions of the top and bottom surfaces of the conductive sheet 102. Interconnect structures 1700 and 1900 each have an arrangement of 15 signal connections and a reference plane connection that spans the entirety of the exposed top and bottom surfaces of the conductive sheet 102. In other embodiments, rather than a single reference plane connection, multiple reference plane connections may be formed in openings located between the 15 signal connections. In this manner, an interconnect structure is configurable to provide a larger or smaller number of signal connections in a same area, while still providing reference plane connections.

By now it should be appreciated that there has been provided an interconnect structure that includes conductive columns that extend through a reference plane structure, where each conductive column has a surrounding isolation structure that laterally separates and electrically isolates the conductive columns from the reference plane structure.

In one embodiment of the present disclosure, an interconnect structure is provided, which includes: a reference plane structure having a first major surface and a second major surface opposite the first major surface, the reference plane structure including a plurality of through holes from the first major surface to the second major surface; a plurality of conductive columns, each conductive column positioned within a through hole; and a plurality of isolation structures, each isolation structure fills an annular region within the through hole between each conductive column and surrounding portion of the reference plane structure.

One aspect of the above embodiment provides that each isolation structure includes a ring-shaped portion that extends away from a perimeter of the through hole over a portion of the first major surface of the reference plane structure.

Another aspect of the above embodiment provides that a top surface of each isolation structure extends beyond the first major surface and a bottom surface of each isolation structure extends beyond the second major surface, and a top surface of each conductive column is coplanar with the top surface of each isolation structure and a bottom surface of each conductive column is coplanar with the bottom surface of each isolation structure.

Another aspect of the above embodiment provides that a top surface of each isolation structure is coplanar with the first major surface and a bottom surface of each isolation structure is coplanar with the second major surface, and a top surface of each conductive column is coplanar with the first major surface and a bottom surface of each conductive column is coplanar with the second major surface.

Another aspect of the above embodiment provides that the interconnect structure further includes solder material on each top surface and bottom surface of each conductive column.

Another aspect of the above embodiment provides that the interconnect structure further includes: solder material over at least a portion of the first major surface of the reference plane structure and around each isolation structure.

Another aspect of the above embodiment provides that the interconnect structure further includes: a portion of conductive material positioned at each end of each conductive column, the portion of conductive material having a width that is larger than a width of the conductive column to provide an extended electrical contact area for each end of each conductive column.

Another aspect of the above embodiment provides that the interconnect structure further includes: at least a first portion and a second portion of conductive material respectively positioned over the first and second major surfaces of the reference plane structure between each isolation structure to provide extended electrical contact areas for the reference plane structure.

Another aspect of the above embodiment provides that the interconnect structure further includes: a solder mask over at least a portion of the first major surface of the reference plane structure, wherein the solder mask includes a first plurality of openings, each of the first plurality of openings aligned to a top surface of each conductive column to define an electrical contact area for the conductive column, and the solder mask further includes a second plurality of openings, each of the second plurality of openings positioned over a portion of the first major surface of the reference plane structure to define an electrical contact area for the reference plane structure.

A further aspect of the above embodiment provides that the interconnect structure further includes: a layer of conductive material within each of the first and second plurality of openings.

Another aspect of the above embodiment provides that the interconnect structure further includes: dielectric material over each minor surface of the reference plane structure, each minor surface being perpendicular to the first and second major surfaces.

Another aspect of the above embodiment provides that the reference plane structure includes a copper sheet including the plurality of through holes.

Another aspect of the above embodiment provides that the plurality of conductive columns includes at least one of a group including copper and solder.

Another aspect of the above embodiment provides that the interconnect structure is located between a package substrate and a printed circuit board (PCB), each conductive column forms an interconnect between a respective signal pad of the package substrate and a respective signal pad of the PCB.

A further aspect of the above embodiment provides that the interconnect structure further includes at least one interconnect formed through a portion of the reference plane structure between a respective ground pad of the package substrate and a respective ground pad of the PCB.

In another embodiment of the present disclosure, an interconnect structure is provided, which includes: a reference plane structure having a first major surface and a second major surface opposite the first major surface, the reference plane structure including a plurality of through holes from the first major surface to the second major surface; a plurality of conductive columns, each conductive column positioned within a through hole; a plurality of isolation structures, each isolation structure fills an annular region within the through hole between each conductive column and surrounding portion of the reference plane structure, each isolation structure including: a first plurality of openings aligned to each conductive column to define an electrical contact area for the conductive column; and a first dielectric material layer over the first major surface of the reference plane structure and a second dielectric material layer over the second major surface of the reference plane structure, each dielectric material layer including: a second plurality of openings positioned over a portion of the reference plane structure to define an electrical contact area for the reference plane structure.

One aspect of the above embodiment provides that the interconnect structure further includes: conductive material within each of the first and second plurality of openings.

Another aspect of the above embodiment provides that the interconnect structure further includes: additional dielectric material layers over each minor surface of the reference plane structure, each minor surface being perpendicular to the first and second major surfaces.

Another aspect of the above embodiment provides that the first and second dielectric material layers include a B-stage dielectric material.

Another aspect of the above embodiment provides that the interconnect structure is located between a package substrate and a printed circuit board (PCB), each electrical contact area of the conductive columns defined by the first dielectric material layer joined to a respective signal pad of the package substrate, each electrical contact area of the reference plane structure defined by the first dielectric material layer joined to a respective ground pad of the package substrate, each electrical contact area of the conductive columns defined by the second dielectric material layer joined to a respective ground pad of the package substrate, and each electrical contact area of the reference plane structure defined by the second dielectric material layer joined to a respective ground pad of the PCB.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value.

Although the invention is described herein with reference to specific embodiments, various modifications and changes can be made without departing from the scope of the present invention as set forth in the claims below. For example, additional or fewer external electrical connections may be implemented in the interconnect structures of FIG. 14-30. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An interconnect structure comprising:
    a reference plane structure having a first major surface and a second major surface opposite the first major surface, the reference plane structure including a plurality of through holes from the first major surface to the second major surface;
    a plurality of conductive columns, each conductive column positioned within a through hole;
    a plurality of isolation structures, each isolation structure fills an annular region within the through hole between each conductive column and surrounding portion of the reference plane structure; and
    a solder mask over at least a portion of the first major surface of the reference plane structure, wherein
        the solder mask comprises a first plurality of openings, each of the first plurality of openings aligned to a top surface of each conductive column to define first electrical contact areas for the conductive columns, and
        the solder mask further comprises a second plurality of openings, each of the second plurality of openings positioned over a portion of the first major surface of the reference plane structure to define second electrical contact areas for the reference plane structure.

2. The interconnect structure of claim 1, wherein
    each isolation structure comprises dielectric material, each isolation structure having a first ring-shaped portion that extends over a portion of the first major surface of the reference plane structure around the through hole, and having a second ring-shaped portion that extends over a portion of the second major surface of the reference plane structure around the through hole.

3. The interconnect structure of claim 1, wherein
    a top surface of each isolation structure extends beyond the first major surface and a bottom surface of each isolation structure extends beyond the second major surface, and
    a top surface of each conductive column is coplanar with the top surface of each isolation structure and a bottom surface of each conductive column is coplanar with the bottom surface of each isolation structure.

4. The interconnect structure of claim 1, wherein
a top surface of each isolation structure is coplanar with the first major surface and a bottom surface of each isolation structure is coplanar with the second major surface, and
a top surface of each conductive column is coplanar with the first major surface and a bottom surface of each conductive column is coplanar with the second major surface.

5. The interconnect structure of claim 1, further comprising:
solder material on each top surface and bottom surface of each conductive column.

6. The interconnect structure of claim 1, further comprising:
solder material over at least a portion of the first major surface of the reference plane structure and around each isolation structure.

7. The interconnect structure of claim 1, further comprising:
a portion of conductive material positioned at each end of each conductive column, the portion of conductive material having a width that is larger than a width of the conductive column to provide an extended electrical contact area for each end of each conductive column.

8. The interconnect structure of claim 1, further comprising:
at least a first portion and a second portion of conductive material respectively positioned over the first and second major surfaces of the reference plane structure between each isolation structure to provide extended electrical contact areas for the reference plane structure.

9. The interconnect structure of claim 1, further comprising:
a layer of conductive material within each of the first and second plurality of openings.

10. The interconnect structure of claim 1, further comprising:
dielectric material over each minor surface of the reference plane structure, each minor surface being perpendicular to the first and second major surfaces.

11. The interconnect structure of claim 1, wherein
the reference plane structure comprises a copper sheet including the plurality of through holes.

12. The interconnect structure of claim 1, wherein
the plurality of conductive columns comprises at least one of a group including copper and solder.

13. The interconnect structure of claim 1, wherein
the interconnect structure is located between a package substrate and a printed circuit board (PCB), each conductive column forms an interconnect between a respective signal pad of the package substrate and a respective signal pad of the PCB.

14. The interconnect structure of claim 13, wherein
the interconnect structure further comprises at least one interconnect formed through a portion of the reference plane structure between a respective ground pad of the package substrate and a respective ground pad of the PCB.

15. The interconnect structure of claim 1, further comprising:
a first dielectric material layer over at least a portion of the first major surface of the reference plane structure and a second dielectric material layer over at least a portion of the second major surface of the reference plane structure, wherein
the first and second electrical contact areas are exposed through openings in the first dielectric material layer, and
third electrical contact areas for the conductive columns and fourth electrical contact areas for the reference plane structure are exposed through openings in the second dielectric material layer.

16. The interconnect structure of claim 15, wherein
the first and second dielectric material layers comprise a B-stage dielectric material.

17. The interconnect structure of claim 1, further comprising:
a second solder mask over at least a portion of the second major surface of the reference plane structure, wherein
the second solder mask comprises a third plurality of openings, each of the third plurality of openings aligned to a bottom surface of each conductive column to define third electrical contact areas for the conductive columns, and
the second solder mask further comprises a fourth plurality of openings, each of the fourth plurality of openings positioned over a portion of the second major surface of the reference plane structure to define fourth electrical contact areas for the reference plane structure.

18. The interconnect structure of claim 17, wherein
the interconnect structure is located between a package substrate and a printed circuit board (PCB),
the first electrical contact areas on the first major surface are joined to respective signal pads of the package substrate,
the second electrical contact areas on the first major surface are joined to respective ground pads of the package substrate,
the third electrical contact areas on the second major surface are joined to respective signal pads of the PCB, and
the fourth electrical contact areas on the second major surface are joined to respective ground pads of the PCB.

19. The interconnect structure of claim 15, wherein
at least a portion of the first dielectric material layer is between the first major surface of the reference plane structure and the solder mask.

* * * * *